United States Patent
Tilke et al.

(10) Patent No.: US 12,242,013 B2
(45) Date of Patent: Mar. 4, 2025

(54) STRATIGRAPHIC FORWARD MODELING PLATFORM AND METHODS OF USE

(71) Applicant: Schlumberger Technology Corporation, Sugar Land, TX (US)

(72) Inventors: Peter Tilke, Watertown, MA (US); Marie Etchebes, Clamart (FR); Marie Emeline Cecile LeFranc, Lysaker (NO); Lingchen Zhu, Medford, MA (US); Michael Lis, Houston, TX (US); Remy Sabathier, Orgeval (FR)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 18/467,046

(22) Filed: Sep. 14, 2023

(65) Prior Publication Data

US 2024/0111071 A1    Apr. 4, 2024

Related U.S. Application Data

(60) Provisional application No. 63/375,576, filed on Sep. 14, 2022.

(51) Int. Cl.
*G06F 30/27*    (2020.01)
*G01V 20/00*    (2024.01)

(52) U.S. Cl.
CPC .............. *G01V 20/00* (2024.01); *G06F 30/27* (2020.01)

(58) Field of Classification Search
USPC .......................................................... 703/10
See application file for complete search history.

(56) References Cited

U.S. PATENT DOCUMENTS

| 10,422,924 | B2 | 9/2019 | Zhang |
| 2009/0276157 | A1 | 11/2009 | Wilkinson |
| 2017/0329046 | A1 | 11/2017 | Palmowski |
| 2018/0321404 | A1 | 11/2018 | Klinger |
| 2019/0236455 | A1 | 8/2019 | Taylor |
| 2020/0183046 | A1 | 6/2020 | Wheelock |
| 2020/0204822 | A1 | 6/2020 | Liu |
| 2020/0308934 | A1 | 10/2020 | Li |
| 2021/0110280 | A1 | 4/2021 | Akkurt |

(Continued)

FOREIGN PATENT DOCUMENTS

| AU | 2012357785 B2 | 12/2014 |
| KR | 102279772 B1 | 7/2021 |

(Continued)

OTHER PUBLICATIONS

Oord et al., "Neural Discrete Representation Learning," in CoRR, abs/1711.00937, 2017, May 30, 2018 (11 pages).

(Continued)

*Primary Examiner* — Bryce M Aisaka
(74) *Attorney, Agent, or Firm* — Michael L. Flynn

(57) ABSTRACT

A process mimicking forward modeler with deposition and erosion at each specific geological time step. The 3D derived properties are high resolution depositional environments and rock properties that are used to generate multiscale labelled synthetic data. These synthetic data can range from 1D logs such as grain size, gamma ray, density, and velocity, to 3D synthetic seismic, and are used directly as training data for various AIML applications.

15 Claims, 7 Drawing Sheets

(56) References Cited

U.S. PATENT DOCUMENTS

| | | | |
|---|---|---|---|
| 2021/0165937 | A1 | 6/2021 | Bailey et al. |
| 2022/0082729 | A1* | 3/2022 | Algheryafi ............. G01V 20/00 |
| 2023/0088055 | A1 | 3/2023 | Tilke |

FOREIGN PATENT DOCUMENTS

| | | | |
|---|---|---|---|
| WO | 2013188911 | A1 | 12/2013 |
| WO | 2017076966 | A1 | 5/2017 |
| WO | 2018208634 | A1 | 11/2018 |
| WO | 2020146863 | A1 | 7/2020 |
| WO | 2021150929 | A1 | 7/2021 |
| WO | 2023044144 | A1 | 3/2023 |
| WO | 2023044146 | A1 | 3/2023 |

OTHER PUBLICATIONS

Kingma et al., An Introduction to Variational Autoencoders, Now, Foundations and Trends, 2019, Dec. 11, 2019, (89 pages).
Find Ancient River Channels, downloaded on Jan. 30, 2023 from (https://xeek.ai/challenges/gamma-log-facies/overview) (3 pages).
Character of Log Response—SEPM Strata, downloaded on Jan. 30, 2023 from (http://sepmstrata.org/page.aspxpageid=168 3) (3 pages).
Well Log Suites—SEPM Strata downloaded on Jan. 30, 2023 from (http://sepmstrata.org/page.aspx pageid=167 3) (2 pages).
Kendall et al., 2005, System Tract Bounding Surfaces, Lithofacies, Geometric Hierarchies and Stacking Patterns: Keys to Shallow Water Carbonate Interpretation, AAPG Bulletin, vol. 89, Program Abstracts (1 pages).
Krassay, A.A., 1998, Outcrop and drill core gamma-ray logging integrated with sequence stratigraphy: exmaples from Proterozoic sedimentary successions of northern Australia, AGSO Journal of Australian Geology and Geophysics 17(4), 285-299.
Schiltz M., 2020, On the use of CPTs in stratigraphy: recent observations and some illustrative cases, Geologica belgica 23/3-4: 399-411.
Soil Hollandse Kust (zuid) • Offshorewind RVO, downloaded on Jan. 30, 2023 from (https://offshorewind.rvo.nl/soilzh) (6 pages).
International Search Report and Written Opinion issued in PCT Application PCT/US2022/044083, dated Jan. 18, 2023 (11 pages).
Jobe et al., Automated Interpretation of Depositional Environments using measured Stratigraphic Sections and Machine-Learning Models, 2019 AAPG Annual Convention and Exhibition, Jun. 30, 2019, pp. 1.
Wu et al., Machine Learning-Based Method for Automated Well Log Processing and Interpretation, 2018 SEG International Exposition and Annual Meeting, Oct. 14, 2018, pp. 2041-2045.
Zoph et al., Tranfer Learning for Low-Resource Neural Machine Translation, Proceedings of the 2016 Conference on Empirical Methods in Natural Language Processing, Nov. 2016, pp. 1-8.
Tetzlaff et al., 2014, GPM (Geologic Process Modeling), Schlumberger, available in Petrel (17 pages).
Flumy, downloaded on Jan. 30, 2023 from (https://flumy.minesparis.psl.eu/download/) (6 pages).
"DionisosFlow (Beicip—Franlab), downloaded on Jan. 30, 2023 from https://beicip.com/, (3 pages)".
Delft3d, downloaded on Jan. 30, 2023 from (https://oss.deltares.nl/web/delft3d) (3 pages).
Dupont et al., [2018]. Generating Realistic Geology Conditioned on Physical Measurements with Generative Adversarial Networks. Arxiv: 1802.03065. (10 pages).
Folk et al., [1957]. Brazos River bar [Texas]; a study in the significance of grain size parameters. J Sediment Res 27, 3-26.
Howard et al., [1984]. Sufficient Conditions for River Meandering: A Simulation Approach. Water Resources Research 20, 1659-1667.
Krumbein [1934]. Size frequency distributions of sediments. J Sediment Res 4, 65-77.
Pyrcz et al., [2014]. Process-mimicking Modeling Considerations. in William C. Gussow Geoscience Conference (16 pages).
Sylvester et al., [2019]. High curvatures drive river meandering. Geology 47, 263-266.
Sylvester et al., [2021]. Autogenic translation and counter point bar deposition in meandering rivers. GSA Bulletin (18 pages).
Zhang et al., Generating Geologically Realistic 3D Reservoir Facies Models Using Deep Learning of Sedimentary Architecture with Generative Adversarial Networks, Petroleum Science, 2019 (10 pages).
Tulyakov et al., "MoCoGAN: Decomposing Motion and Content for Video Generation," in IEEE Conference on Computer Vision and Pattern Recognition (CVPR), 2018. (13 pages).
Cho et al., "Learning Phrase Representations using RNN Encoder-Decoder for Statistical Machine Translation," in Conference on Empirical Methods in Natural Language Processing, 2014. (15 pages).
Hochreiter et al., "Long Short-term Memory," Neural Computation, vol. 9, No. 8: 1735-1780, 1997.
Goodfellow, "NIPS 2016 Tutorial: Generative Adversarial Networks," in Neural Information Processing Systems, 2016. (57 pages).
Gulrajani et al., "Improved Training of Wasserstein GANs," in Proceedings of the 31st International Conference on Neural Information Processing Systems, 2017. (20 pages).
International Search Report and Written Opinion issued in PCT Application PCT/US2022/044087, dated Jan. 6, 2023 (10 pages).
Kahembwe et al., Lower Dimensional Kernels for Video Discriminators, Neural Networks, vol. 132, pp. 506-520, Sep. 26, 2020.
Yushchenko et al., Markov Decision Process for Video Generation, 2019 IEEE/CVF International Conference on Computer Vision Workshop (ICCVW), pp. 1523-1532, Oct. 27-28, 2019.
Robertson P.K., 2010a. Soil behaviour type from the CPT: an update. 2nd International Symposium on Cone Penetration Testing, Huntington Beach, CA, USA. vol. 2, 575-583.
Robertson P.K., 2010b. Estimating in-situ soil permeability from CPT and CPTu. 2nd International Symposium on Cone Penetration Testing, Huntington Beach, CA, USA. vol. 2, 535-542.
International Preliminary Report on Patentability issued in the PCT Application No. PCT/US2022/044087 dated Apr. 4, 2024, 6 pages.
International Preliminary Report on Patentability issued in the PCT Application No. PCT/US2022/044083 dated Apr. 4, 2024, 6 pages.
Office Action issued in U.S. Appl. No. 17/933,506 dated May 24, 2024, 40 pages.
Office Action issued in U.S. Appl. No. 18/693,042 dated Aug. 23, 2024, 20 pages.

* cited by examiner

STRATIGRAPHIC FORWARD MODELING PLATFORM AND METHODS OF USE

CROSS-REFERENCE TO RELATED APPLICATIONS

The present application claims priority benefit of U.S. Provisional Application No. 63/375,576 filed Sep. 14, 2022, the entirety of which is incorporated by reference herein and should be considered part of this specification.

BACKGROUND

The present disclosure generally relates to stratigraphic forward modeling platform (SFM).

Integrating stratigraphic processes in 3D modeling is the best way to avoid generating unrealistic representations of the subsurface leading to inaccurate forecasting of reservoir production, $CO_2$ sequestration capacity, or fluid migration for geothermal energy production. The conventional workflows for the interpretation of stratigraphy from well log, seismic, and 3D stratigraphic modeling tools are often tedious, manual, isolated, and time-consuming steps. Therefore, the use of artificial intelligence and machine learning (AIML) algorithms to automate these various different steps would be a significant advantage in integrating stratigraphic processes in 3D modeling; however, to be useful, AIML often requires a significant amount of multiscale training datasets. Training AIML engines utilizing real interpreted well logs, 3D seismic, or 3D facies models is not feasible due to huge dataset requirements. Therefore, there is a need for a more complete dataset that is properly labeled, diverse, and free from sampling and user bias.

BRIEF DESCRIPTION OF THE FIGURES

Certain embodiments, features, aspects, and advantages of the disclosure will hereafter be described with reference to the accompanying drawings, wherein like reference numerals denote like elements. It should be understood that the accompanying figures illustrate the various implementations described herein and are not meant to limit the scope of various technologies described herein.

DETAILED DESCRIPTION

In the following description, numerous details are set forth to provide an understanding of some embodiments of the present disclosure. It is to be understood that the following disclosure provides many different embodiments, or examples, for implementing different features of various embodiments. Specific examples of components and arrangements are described below to simplify the disclosure. These are, of course, merely examples and are not intended to be limiting. However, it will be understood by those of ordinary skill in the art that the system and/or methodology may be practiced without these details and that numerous variations or modifications from the described embodiments are possible. This description is not to be taken in a limiting sense, but rather made merely for the purpose of describing general principles of the implementations. The scope of the described implementations should be ascertained with reference to the issued claims.

As used herein, the terms "connect", "connection", "connected", "in connection with", and "connecting" are used to mean "in direct connection with" or "in connection with via one or more elements"; and the term "set" is used to mean "one element" or "more than one element". Further, the terms "couple", "coupling", "coupled", "coupled together", and "coupled with" are used to mean "directly coupled together" or "coupled together via one or more elements". As used herein, the terms "up" and "down"; "upper" and "lower"; "top" and "bottom"; and other like terms indicating relative positions to a given point or element are utilized to more clearly describe some elements. Commonly, these terms relate to a reference point at the surface from which drilling operations are initiated as being the top point and the total depth being the lowest point, wherein the well (e.g., wellbore, borehole) is vertical, horizontal or slanted relative to the surface.

The disclosed methods and platform(s) provide a needed complete synthetic data set using synthetic measurements, at a reservoir scale, for artificial intelligence and machine learning (AIML)-based subsurface interpretation workflows and application of the synthetic data set to AIML-based workflows.

Figure 1:
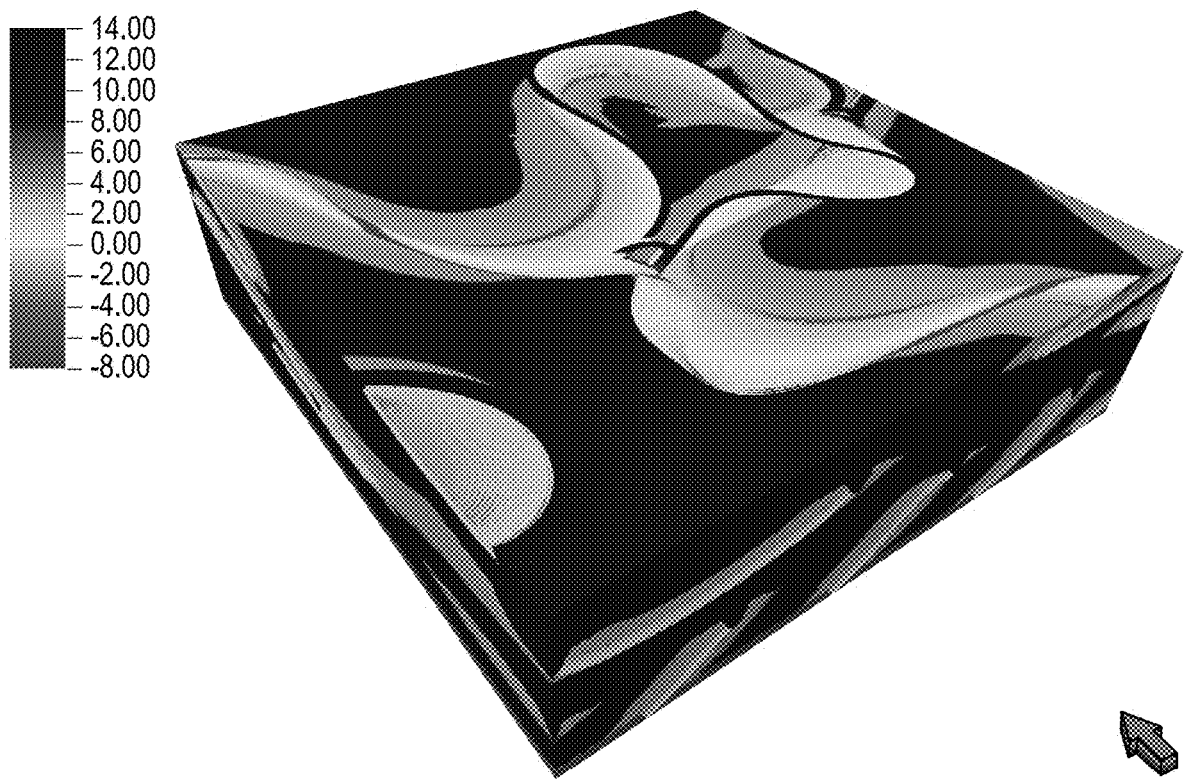
FIG. 1 shows an embodiment of a resulting grain size distribution generated by the SFM.

There is shown in FIG. 1 an example of grain size volume. The grain size is represented using the Krumbein (1934) phi ($\varphi$) scale in which the smaller the phi ($\varphi$) number, the greater the coarseness the material. For example, clay has $\varphi>8$, silt is intermediate and has $\varphi$ from 8 to 4, sand has $\varphi$ from 4 to $-1$, and gravel has $\varphi$ from $-1$ to $-6$.

In one or more embodiments, the method can comprise generating synthetic stratigraphic models at the reservoir scale using process mimicking algorithms. The method can also comprise generating multiple different depositional facies including channel lag and overbank deposits, point bars, levees, oxbow lakes, and crevasse splays.

The method can comprise multiple depositional environments including but not limited to Continental, Shelf and Shallow Clastic Seas, Shallow Marine, Deep Marine, and others such as Volcanic and Tsunami.

The method can comprise multiple facies of different composition including Siliciclastic, Carbonate, Evaporite, Organic-rich, Siliceous, Iron-rich, and Phosphatic.

The method can further comprise using a time stepping approach where each time step is in geological time such as years (a for annum), kilo-years (Ka), or mega-years (Ma), and defining an initial topography and rates of subsidence and uplift over an areal region of interest. The method can also comprise computing a deposition of depositional facies (depofacies) during each time step over a predefined map area and a net thickness of each depofacies during each time step over a predefined map area. The method further comprises computing a total thickness of deposition during each time step over a predefined map area and erosion, compaction and diagenesis of underlying sediment during each time step over a predefined map area.

The method can also comprise computing 3D petrophysical and rock properties such as depofacies classification, porosity, a grain size and grain sorting for each depofacies as a function of spatial location (latitude, longitude, elevation) and relative position to sources of active deposition. The method can further comprise generating petrophysical and rock physics properties based on spatial distribution, grain size and sorting including clay fraction, natural gamma radiation from K, U, and Th concentrations, porosity, matrix, bulk, and saturated density, bulk, dry bulk, and shear moduli. P and S velocities, and seismic properties such as acoustic impedance.

The method can further comprise generating multiple realizations of each stratigraphic model based on random seed and different hyperparameters such as channel width and depth, deposition rates and properties of each depofacies such as characteristic levee width and variability.

The method can further comprise storing each model in cloud indexed in geological time. The method can also comprise allowing geological time-based model to be converted to true vertical depth (TVD) for consumption by modeling and interpretation applications.

The method can also comprise making geological age the primary index of the model. The method can also comprise converting to TVD index and making the geological age an additional property of the model.

Tremendous progress has been made in the forward modeling of fluvial meandering systems as demonstrated by for example Pyrcz, M. et al. 2014, Sylvester et al. 2019, and Sylvester et al. 2021. The forward modeling demonstrated by these authors has been enabled by contemporary computational capabilities applied to the pioneering modeling work of Howard and Knutson (1984). A key insight of Howard and Knutson (1984) and others is that migration rates can be forecast based on the upstream curvature.

Embodiments of the SFM disclosed herein build 3D stratigraphic reservoir models that are not only labeled with depofacies (e.g., crevasse splays, point bar, levee, floodplain, and channels) but, in addition, have a wide spectrum of geological and petrophysical properties including, but not limited to, net to gross of the different facies, grain size, relative age, deposition rate, elevation/bathymetry, porosity, strike and dips at both the borehole and seismic scale.

Furthermore, the SFM disclosed herein mimics geological processes with deposition and erosion at each specified geological time step. For example, for fluvial environments, hyper parameters are both geometrical: channel thickness, mean levee width, crevasse splay thickness, etc., and linked to the deposition processes: initial regional topography, aggradation rate, friction etc. The results of the SFM are 3D labeled stratigraphic models that are realistic, and with a vertical and lateral resolution that can be controlled.

As previously noted, multiple depositional features are currently supported by the SFM including channel lag and overbank deposits, point bars, levees, oxbow lakes, and crevasse splays. At a given point in space and time, multiple depofacies may be deposited during a computational time step. For example, if the time step is 1 year, then a point bar deposit may be overlain by the silty sediments of a seasonal flooding event. As a result, each depofacies contributes a different net thickness to the overall gross thickness. To represent this, for each geological time step, the SFM generates maps of not only gross thickness but also net to gross fractions for all depofacies. It should also be understood that the SFM can support more kinds of depositional features other than the aforementioned.

Grain size is a key property related to the energy of the system. The grain size can be represented with the dimensionless Krumbein (1934) phi (y) scale, as noted above. Each depofacies has an associated range of grain sizes. With this foundation for fluvial meandering systems, the SFM disclosed herein provides 3D stratigraphic reservoir models that are not only labeled with lithofacies (e.g., crevasse splays, point bar, levee, floodplain, and channels) but have a wide spectrum of geological and petrophysical properties that include net to gross of the different facies, grain size, relative age, deposition rate, elevation/bathymetry, porosity, strike and dips at both the borehole and seismic scale, and synthetic seismic.

The combination at each geological time step of thickness, net to gross lithofacies ratios, and grain size allows the user(s) of the method(s) to forward model multiple petrophysical and rock physics properties. These properties include but are not limited to: clay fraction, natural gamma radiation from K, U, and Th concentrations, porosity matrix, bulk, and saturated density, bulk, dry bulk, and shear moduli, P and S velocities.

Figure 2A:
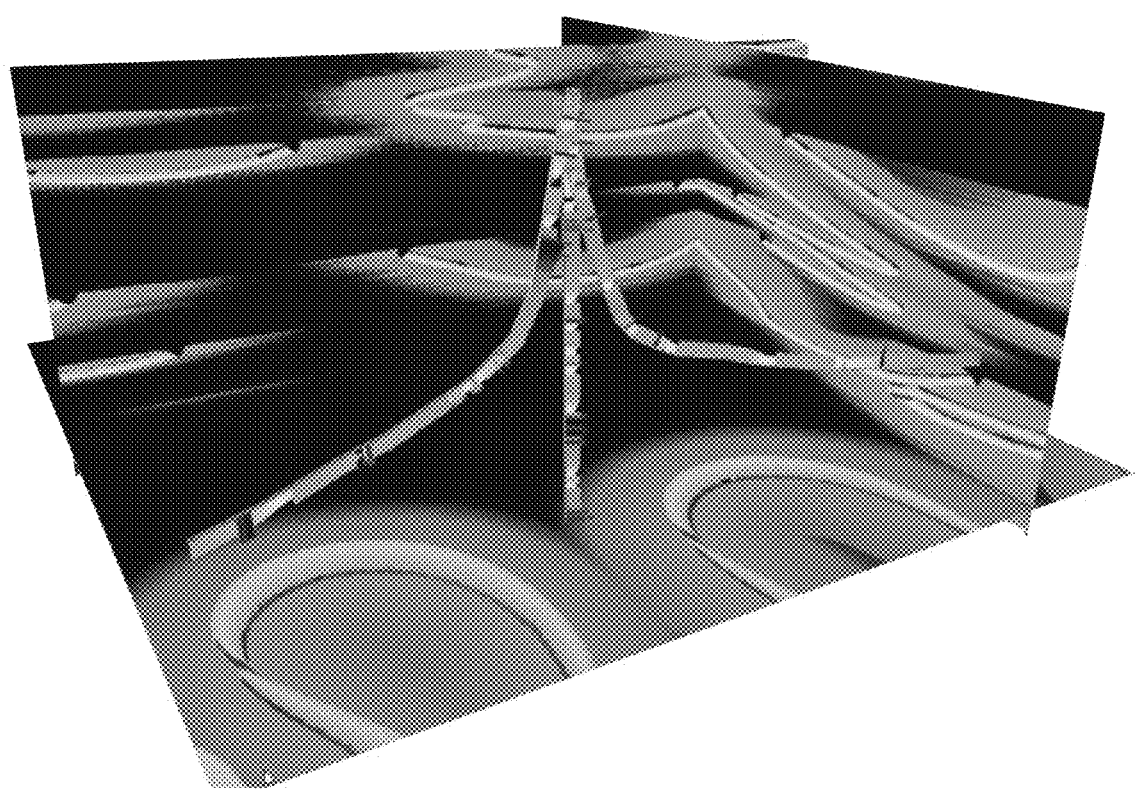
FIGS. 2A-2D disclose SFM generated model in depth domain with inline, crossline, and depth slices

The models generated by the SFM are in the geological time domain and stored natively in HDF format. However, to be consumed by interpretation and modeling applications, the models can be converted to the depth domain in formats consistent with for example seismic (ZGY format) and well logs (LAS format.). With these supported depth representations, synthetic well log and seismic measurements can be extracted and consumed by standard interpretation and modeling applications (FIG. 2.). FIGS. 2A-2D disclose SFM generated model in depth domain with inline, crossline, and depth slices. There is shown in FIG. 2A SFM generated model illustrating fine (blue) to coarse (red) grain size property in depth domain with three wells—one vertical and two high angle. Grain size property is illustrated in FIG. 2A with three penetrating wells and the associated log signatures extracted from the model. Synthetic seismic created from a set of derived SFM properties is also shown.

Figure 2B:
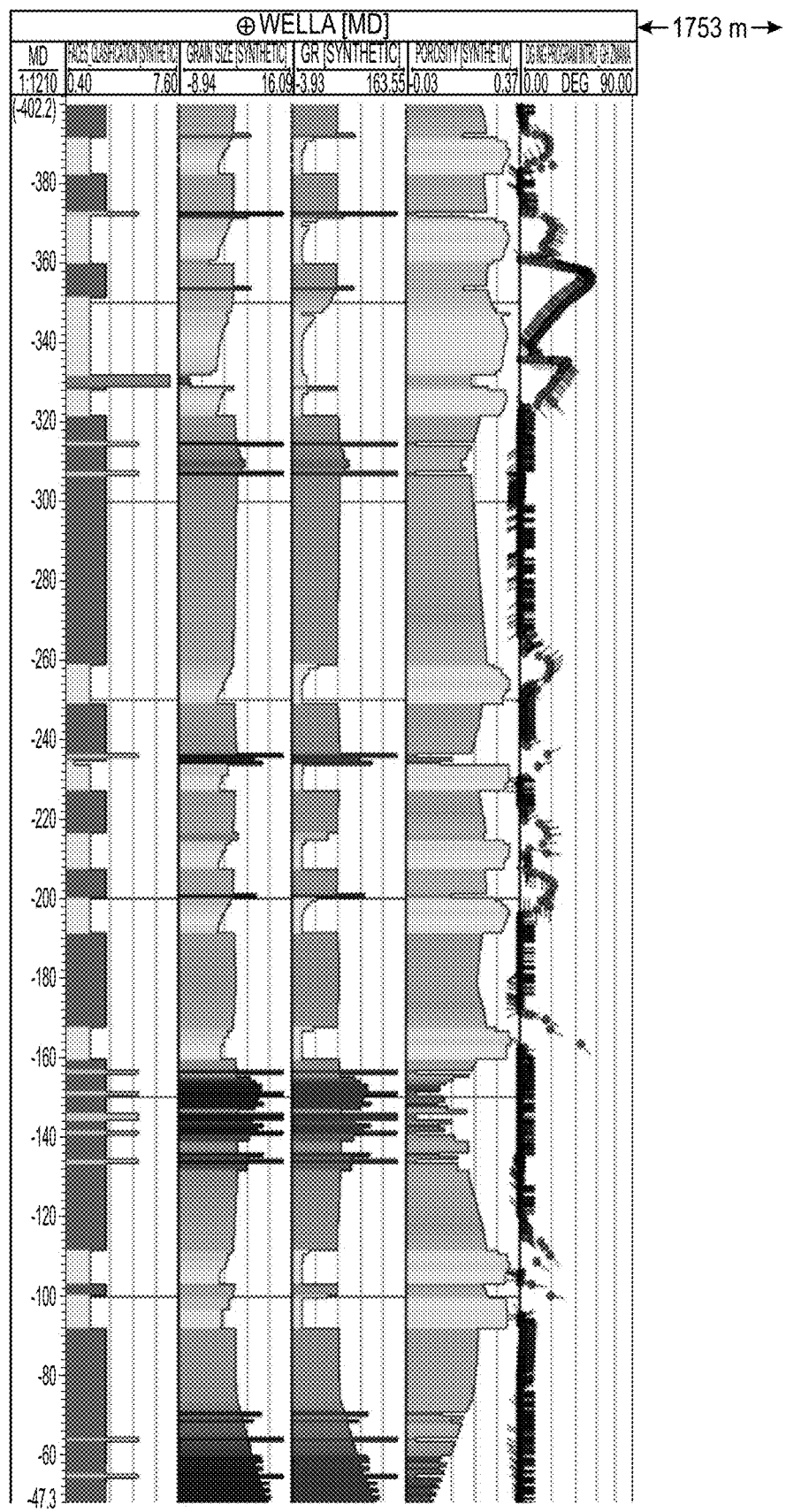
Figure 2B:
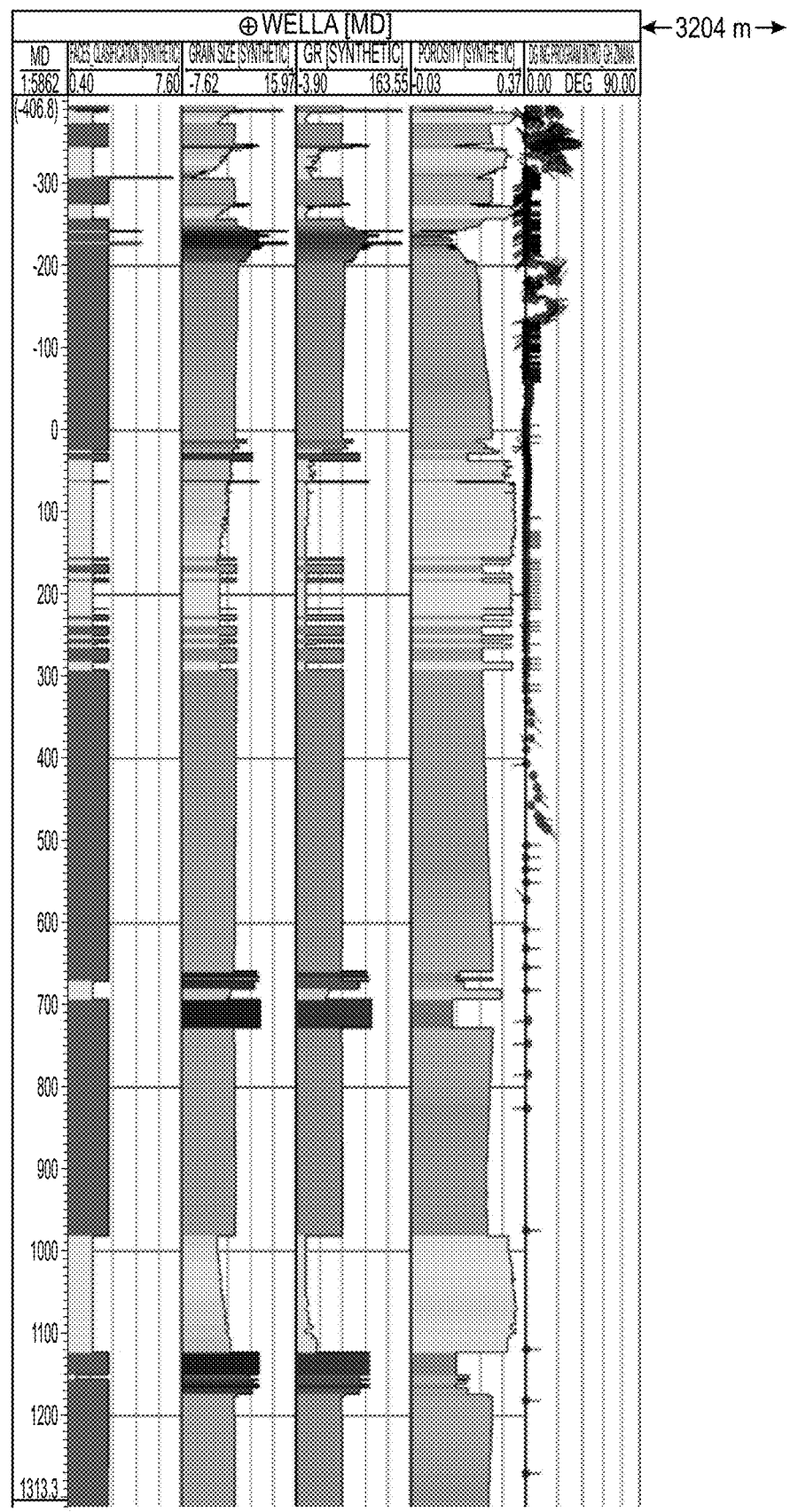
Figure 2B:
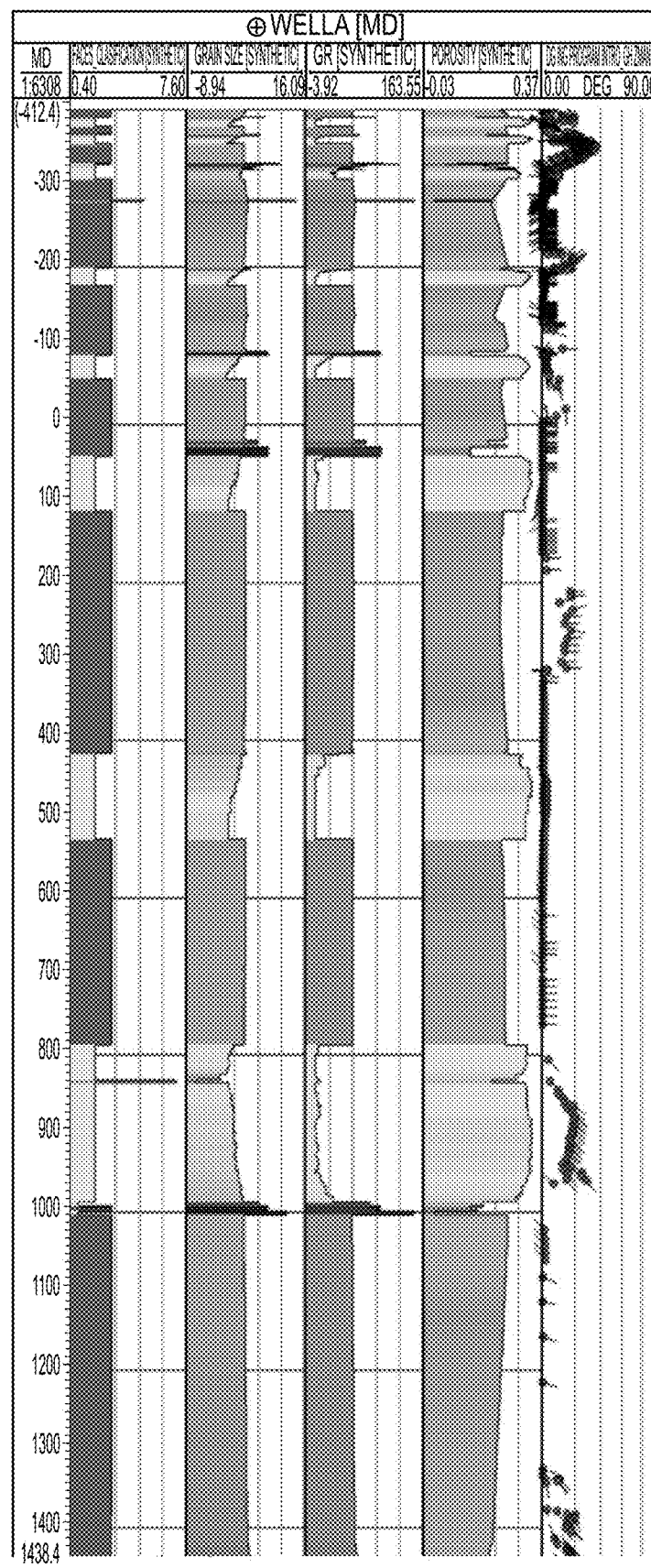

There is shown in FIG. 2B, well logs for each of the wells in FIG. 2A. Tracks from left to right are facies classification, grain size, gamma ray, porosity, and dip.

Figure 2C:
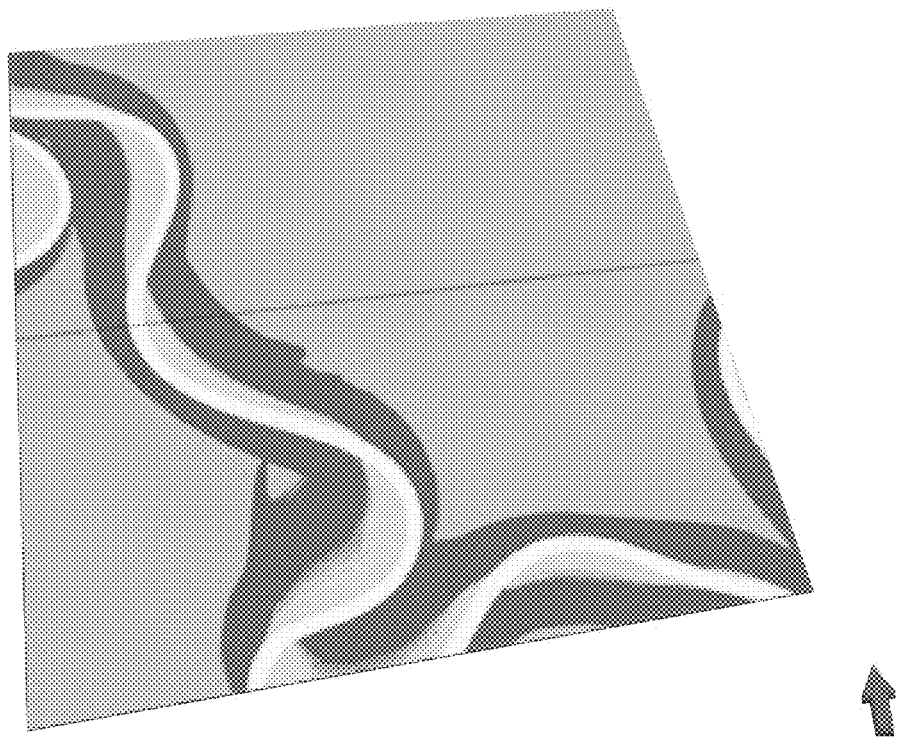
Figure 2D:
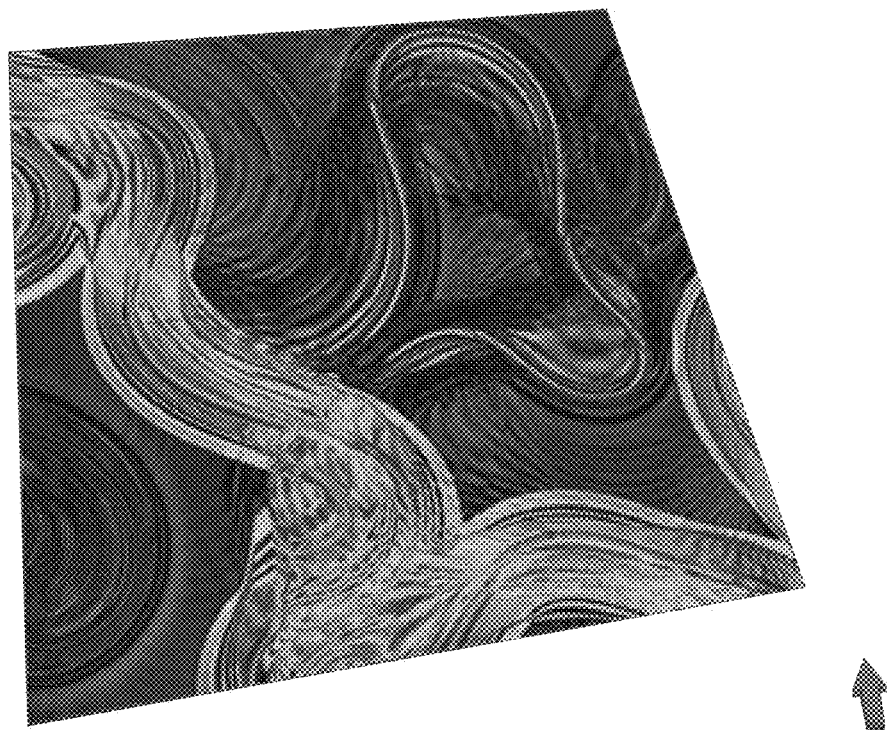

There is shown in FIG. 2D, labelled synthetic seismic, which were created using facies property, shown in FIG. 2C, Vp, Vs, and density cubes.

One embodiment of an application of the SFM is to create synthetic data. The SFM advantageously provides simulation-based data synthesis. Synthetic data is not real data, and as such has many advantages for the use of synthetic data by AIML over any approach based explicitly or implicitly on real data (El Emam 2020). Synthetically generated data is advantageously automatically and accurately labeled. The full spectrum of physically plausible states can therefore be modeled, thereby managing class bias that is disadvantageously ubiquitous in real data. Vast amounts of synthetic data can now be generated using parallelized cloud computing, discussed in more detail below, at a cost which is generally much lower than acquiring real data. In addition, there are significantly lessened privacy or security concerns with this type of synthetic data.

If based on a physical model, synthetic data may be relatively simplistic. However, this simplicity may generally be addressed by increasing the sophistication of the model as required. Real data acquired from sensors or other measurements include noise and bias, which may be added to the synthetic data and thereby increase the sophistication of the synthetic data set.

SFM generated models can be used in a variety of AIML contexts and use cases. For example, the models can be treated as a library of geologic analogs in which the geoscientist searches for stratigraphic environments and facies that can explain the current context that is being studied.

Additionally, this library of models is used to train various AIML based interpretation workflows such as Generative Adversarial Network (GAN) based well conditioning (Dupont et al. 2018) for fast 3D modeling. The synthetic seismic library from the SFM is used to train 3D convolutional neural network(s) (CNN) for automatic interpretation and labelling of seismic geobodies. Finally, the synthetic well log library may be used to train deep learning-based architectures such as Convolutional Neural Network (CNN), UNet, ResNet or Long Short-Term Memory (LSTM) for multiscale automatic stratigraphy interpretation along and between wells.

Figure 3:
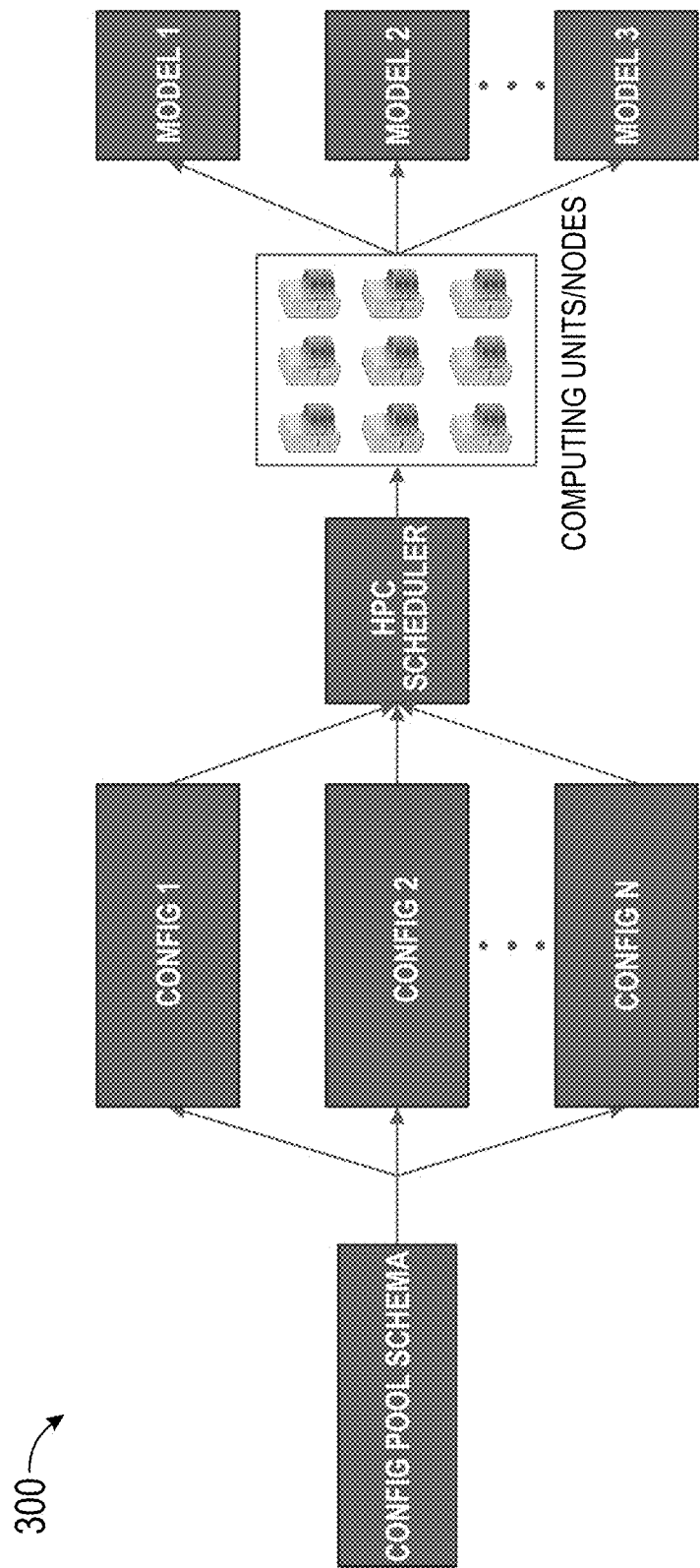
FIG. 3 shows an embodiment of the SFM running on a high performance computing platform.

SFM can generate models in parallel by either local or cloud-based high-performance computing (HPC) platforms, with each computing unit/node running a separate set of configurations including, but not limited to, channel width, depth, deposition rates and properties of each depofacies such as characteristic levee width and variability. There is shown in FIG. 3, the use case of SFM running in a high-performance computing (HPC) platform 300. In FIG. 3, the platform 300 may comprise a configuration pool schematic utilizing a plurality of configurations (Config 1, Config 2, . . . Config N), which may be organized and/or arranged by a scheduler for the HPC 300. The scheduler sends instructions to multiple computing units/nodes, which run, utilizing parallelized cloud computing, various models (Model 1, Model 2, . . . Model N), as will be appreciated by those skilled in the art. The various models generate the synthetic data sets.

By such means, such as by utilizing the HPC 300 shown in FIG. 3, SFM can advantageously create as many models as possible simultaneously if sufficient computing resources are present (i.e., the multiple computing units/nodes shown in FIG. 3) to help prepare the training datasets for the downstream AIML applications. SFM can save the generated data sets of the models by the aforementioned high-performance computing method to either local disks or cloud-based storage buckets in different circumstances to facilitate any suitable subsequent data processing procedures.

This disclosed platform demonstrates a process mimicking forward modeler with deposition and erosion at each specific geological time step. The 3D derived properties are high resolution depositional environments and rock properties that are used to generate multiscale labelled synthetic data. These data can range from 1D logs such as grain size, gamma ray, density, and velocity, to 3D synthetic seismic, and may be used directly as training data for various AIML applications.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately," "about," "generally," and "substantially" may refer to an amount that is within less than 10% of, within less than 5% of, within less than 1% of, within less than 0.1% of, and/or within less than 0.01% of the stated amount. As another example, in certain embodiments, the terms "generally parallel" and "substantially parallel" or "generally perpendicular" and "substantially perpendicular" refer to a value, amount, or characteristic that departs from exactly parallel or perpendicular, respectively, by less than or equal to 15 degrees, 10 degrees, 5 degrees, 3 degrees, 1 degree, or 0.1 degree.

Although a few embodiments of the disclosure have been described in detail above, those of ordinary skill in the art will readily appreciate that many modifications are possible without materially departing from the teachings of this disclosure. Accordingly, such modifications are intended to be included within the scope of this disclosure as defined in the claims. It is also contemplated that various combinations or sub-combinations of the specific features and aspects of the embodiments described may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure herein should not be limited by the particular embodiments described above.

What is claimed is:

1. A method of using a stratigraphic forward modeling platform, comprising:
generating at least one synthetic stratigraphic models at the reservoir scale using at least one process mimicking algorithms by generating multiple different depositional facies using a time stepping approach;
defining an initial topography and an initial rates of subsidence and an initial rate of uplift over an area region of interest;
computing deposition of depofacies during each time step over a predefined map area, the predefined map area comprising at least a portion of the areal region of interest;
generating petrophysical and rock physics properties of the depofacies over the predefined map area;
generating multiple realizations of each stratigraphic model based on random seed and different hyperparameters;
storing each of the multiple model realizations and indexing the multiple model realizations in geological time; and
utilizing the stored multiple model realization data sets from the model to train an artificial intelligence and machine learning (AIML) application.

2. The method according to claim 1 wherein generating multiple different depositional facies comprises generating at least one of channel lag and overbank deposits, point bars, levees, oxbow lakes, and crevasse splays.

3. The method according to claim 1 wherein using a time stepping approach comprises utilizing a plurality of time steps in a geological time.

4. The method of claim 3, wherein the plurality of time steps comprise at least one of years (a for annum), kilo-years (Ka), or mega-years (Ma).

5. The method according to claim 3 wherein computing deposition comprises computing a net thickness of each depofacies during each time step over the predefined map area.

6. The method according to claim 3 wherein computing deposition comprises computing a total thickness of deposition during each time step over the predefined map area.

7. The method according to claim 3 wherein computing deposition comprising computing an erosion, compaction and diagenesis of underlying sediment during each time step over the predefined map area.

8. The method according to claim 3 wherein computing deposition comprises computing 3D petrophysical and rock properties such as depofacies classification, porosity, grain size and grain sorting for each depofacies as a function of spatial location (latitude, longitude, elevation) and relative position to sources of active deposition.

9. The method according to claim 1 wherein generating multiple realizations of each stratigraphic model is based on random seed and different hyperparameters such as channel width and depth, deposition rates and properties of each depofacies such as characteristic levee width and variability.

10. The method according to claim 1 wherein storing comprises storing the model realizations in at least one of a local location or a cloud location.

11. The method according to claim 1 further comprising converting the geological time-based model to true vertical depth (TVD) for consumption by modeling and interpretation applications.

12. The method according to claim 11 wherein geological age is a primary index of the time-based model, but when converted to TVD index, the geological age is an additional property of the model.

13. The method according to claim 1 wherein generating petrophysical and rock physics properties based on spatial distribution, grain size and sorting.

14. The method according to claim 1 wherein the AIML application comprises Generative Adversarial Network (GAN) based well conditioning.

15. The method according to claim 1 wherein training comprises training deep learning-based architectures such as Convolutional Neural Network (CNN), UNet, ResNet or Long Short-Term Memory (LSTM) for multiscale automatic stratigraphy interpretation along and among wells.

* * * * *